United States Patent
Ho et al.

(10) Patent No.: US 11,495,639 B1
(45) Date of Patent: Nov. 8, 2022

(54) MEMORY UNIT, ARRAY AND OPERATION METHOD THEREOF

(71) Applicant: MACRONIX International Co., Ltd., Hsinchu (TW)

(72) Inventors: Hsin-Yi Ho, Hsinchu (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/239,306

(22) Filed: Apr. 23, 2021

(51) Int. Cl.
| | |
|---|---|
| *G11C 11/22* | (2006.01) |
| *H01L 27/24* | (2006.01) |
| *H01L 27/11507* | (2017.01) |
| *H01L 27/22* | (2006.01) |
| *G11C 11/16* | (2006.01) |
| *G11C 13/00* | (2006.01) |

(52) U.S. Cl.
CPC ...... *H01L 27/2436* (2013.01); *G11C 11/1659* (2013.01); *G11C 11/1673* (2013.01); *G11C 11/1675* (2013.01); *G11C 11/2259* (2013.01); *G11C 11/2273* (2013.01); *G11C 11/2275* (2013.01); *G11C 13/003* (2013.01); *G11C 13/004* (2013.01); *G11C 13/0069* (2013.01); *H01L 27/11507* (2013.01); *H01L 27/228* (2013.01); *G11C 2213/79* (2013.01)

(58) Field of Classification Search
CPC .......... H01L 27/2436; H01L 27/11507; G11C 11/1659; G11C 11/1673; G11C 11/1675; G11C 11/2259; G11C 11/2273; G11C 11/2275; G11C 13/003; G11C 13/004; G11C 13/0069

USPC ......................................................... 365/145
See application file for complete search history.

(56) References Cited

U.S. PATENT DOCUMENTS

| | | | | |
|---|---|---|---|---|
| 8,451,646 | B2* | 5/2013 | Chi | G11C 13/0007 365/185.05 |
| 8,848,421 | B2* | 9/2014 | Kawai | H01L 45/146 365/185.24 |
| 9,047,965 | B2* | 6/2015 | Alam | G11C 11/16 |
| 9,076,523 | B2* | 7/2015 | Lee | G11C 13/0002 |
| 9,087,580 | B2* | 7/2015 | Widjaja | H01L 27/10802 |
| 9,378,817 | B2* | 6/2016 | Kawai | G11C 13/0064 |
| 9,997,239 | B1* | 6/2018 | Alam | G11C 11/419 |
| 10,290,349 | B2* | 5/2019 | Bertin | G11C 13/0007 |
| 10,311,953 | B2* | 6/2019 | Fackenthal | G11C 13/0011 |
| 10,593,396 | B2* | 3/2020 | Tzoufras | G11C 11/5607 |
| 10,692,569 | B2* | 6/2020 | Tzoufras | G11C 11/1659 |
| 10,847,575 | B2* | 11/2020 | Liu | G11C 11/1673 |
| 10,916,317 | B2* | 2/2021 | Chung | G11C 29/027 |
| 11,289,144 | B1* | 3/2022 | Choy | G11C 11/1697 |

(Continued)

FOREIGN PATENT DOCUMENTS

JP       3878566 B2 *  2/2007  ............. G11C 29/08

OTHER PUBLICATIONS

"Office Action of Taiwan Counterpart Application", dated Nov. 22, 2021, pp. 1-7.

*Primary Examiner* — Viet Q Nguyen
(74) *Attorney, Agent, or Firm* — J.C. Patents

(57) ABSTRACT

A memory unit, array and operation method thereof are provided. The memory unit includes at least one P-type driver having a first end coupled to a power source, a second end and a control end coupled to a word line; a memory cell having a first end coupled to the second end of the P-type driver, and a second end coupled to a bit line.

21 Claims, 4 Drawing Sheets

(56) References Cited

U.S. PATENT DOCUMENTS

| | | |
|---|---|---|
| 2019/0074060 A1 | 3/2019 | Faraoni et al. |
| 2020/0020397 A1 | 1/2020 | Lai et al. |
| 2020/0219574 A1 | 7/2020 | Chung |
| 2022/0101902 A1* | 3/2022 | Ramanan ............ G11C 11/1675 |

* cited by examiner

MEMORY UNIT, ARRAY AND OPERATION METHOD THEREOF

TECHNICAL FIELD

The present invention relates to a memory unit, an array, and an operation method thereof.

DESCRIPTION OF RELATED ART

Phase change memory (PCM) uses changes in the phase of a material to achieve the characteristics of the memory. The phase change memory has the characteristics of small size and long storage time, and can also match the current semiconductor manufacturing technology.

In the current phase change memory structure, an NMOS transistor is usually used as the transistor of the driving element of each memory cell. However, when the process technology reaches the technical level of, for example, 14 nm, the gate electrode of the NMOS transistor is very thin and the breakdown voltage of the oxide layer is too low, making it difficult to be the driving element of the memory cell. Under the existing configuration, writing data to the memory cell requires applying a voltage of about 2.4V to the word line and about 2.5V to the bit line. However, due to the NMOS transistor as the driving element, it cannot withstand higher write times in the write operations with a voltage of 2.4V. Therefore, the current configuration cannot increase the times of write operation and the product life cycle cannot be increased.

Therefore, in the operation of PCM, how to meet the size requirements of the latest process technology and increase the tolerance to write voltage, thereby increasing the product life cycle, is the needs for this technical field.

SUMMARY

In view of the above description, according to one embodiment of the disclosure, a memory unit is provided. The memory unit comprises at least one P-type driving element, having a first end coupled to a power source, a second end and a control end coupled to a word line; and a memory cell, having a first end coupled to the second end of the at least one P-type driving element and a second end coupled to a bit line.

According to another embodiment of the disclosure, an operation method for a memory unit, the memory unit is provided. The memory unit includes at least one P-type driving element, having a first end coupled to a power source, a second end and a control end coupled to a word line; and a memory cell, having a first end coupled to the second end of the at least one P-type driving element and a second end coupled to a bit line. The operation method comprising: in reading the memory unit, applying a first bias condition to the memory unit, wherein a voltage provided by the power source is larger than a voltage applied to the bit line and a voltage applied to the word line, and the voltage applied to the bit line is larger than the voltage applied to the word line; and in setting or resetting the memory unit, applying a second bias condition to the memory unit, wherein a voltage provided by the power source is larger than a voltage applied to the bit line and a voltage applied to the word line, and the voltage applied to the bit line is substantially equal to the voltage applied to the word line.

According to another embodiment of the disclosure, a memory array is provided, and comprises a plurality of word lines, arranged to be parallelly extended in a first direction; a plurality of bit lines, arranged to be parallelly extended in a second direction that is substantially orthogonal to the first direction, and respectively intersected with the plurality of word lines; and a plurality of memory unit, respectively arranged on intersections of the plurality of word lines and the plurality of bit lines. Each of the plurality of memory unit further comprises: at least one P-type driving element, having a first end coupled to a power source, a second end and a control end coupled to a corresponding word line of the plurality of word lines; and a memory cell, having a first end coupled to the second end of the at least one P-type driving element and a second end coupled to a corresponding bit line of the plurality of bit lines.

In the above configurations, the least one P-type driving element is a PMOS transistor.

In the above configurations, the power source may be a current source.

In the above configurations, an endurance time in one million cycles for the memory unit is at least 0.05 seconds.

In the above configurations, a time-dependent dielectric breakdown (TDDB) time of the at least one P-type driving element is longer to a TDDB time of a N-type driving element corresponding to the at least one P-type driving element.

In the above configurations, the memory cell may comprise at least a phase change memory (PCM), a magnetoresistive RAM (MRAM), a resistive RAM (ReRAM) and a ferroelectric RAM (FeRAM).

In summary, based on the above configuration of the memory unit and in comparison with the N-type driving element, the present disclosure utilizes the P-type driving element to drive the memory cell, the memory unit can have a longer product life cycle under higher operation voltage and the reliability can also be increased.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
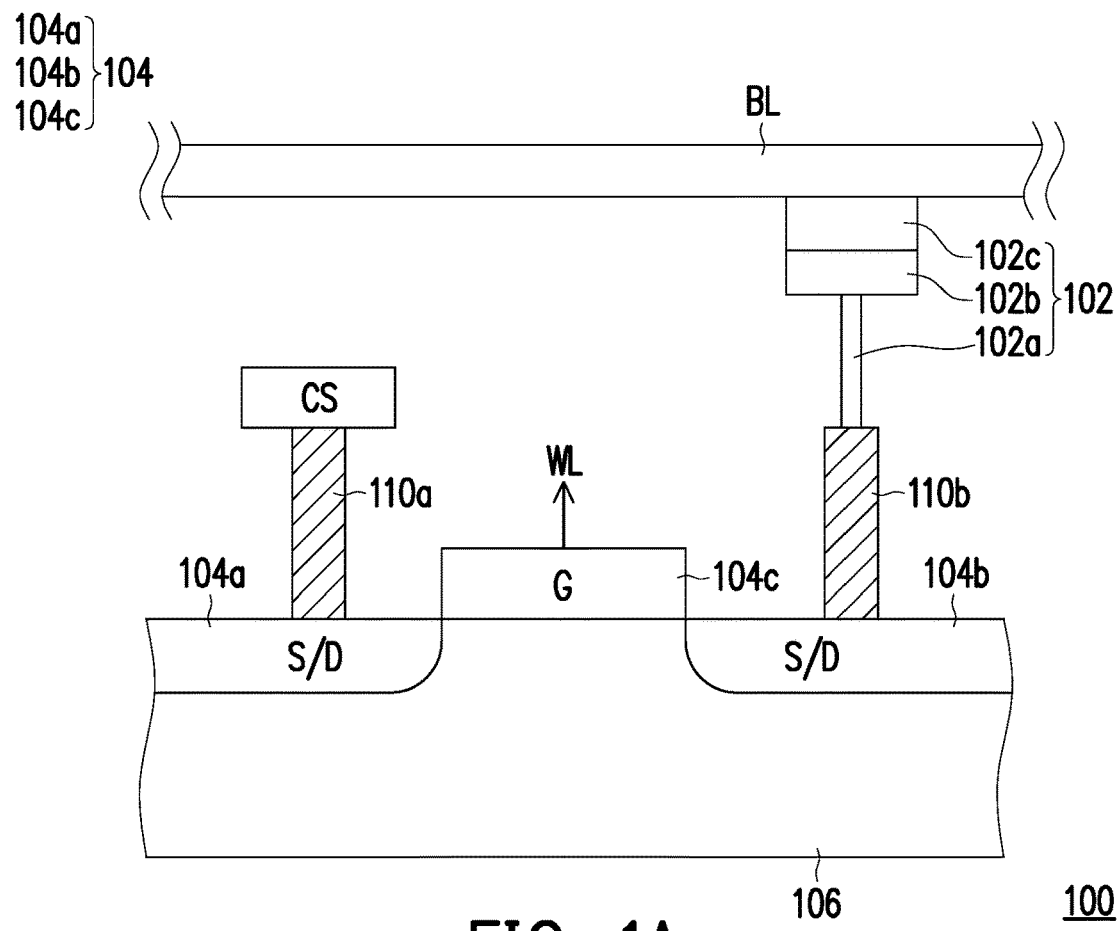
FIG. 1A shows a schematic diagram of a cross-sectional structure of a phase change memory unit according to one embodiment of the disclosure.

FIG. 1A shows a schematic diagram of a cross-sectional structure of a phase change memory unit according to one embodiment of the disclosure. As shown in FIG. 1A, the memory unit 100 comprises a memory cell (such as a variable resistor element) 102 and a driving element 104. In this embodiment, the memory cell 102 is made of phase change material but not limited thereto, and the driving element 104 may be a switching element, such as bipolar junction transistor (BJT), metal oxide semiconductor (MOS) transistor, field effect transistor (FET), diode, etc. In the embodiment, the driving element 104 is a P-type driving element, and a PMOS transistor is used as an example in the following description.

As shown in the cross-sectional view of FIG. 1, the memory unit 100 includes a PMOS transistor 104 with source-drains 104 a, 104 b and a gate 104 c formed on a semiconductor substrate 106. In a memory array, a row of memory units 100 are connected by a word line WL, and the word line WL is connected to the gate (control end) 104c of the PMOS transistor 104 of each memory unit 100. One of the source-drain (first end) 104a of the PMOS transistor 104 is connected to a power source CS via the contact window 110a. The power source CS, for example, is a current source.

In an example, the memory cell 102 may be a variable resistance element made of phase change material, which may include a lower electrode 102a, a phase change material layer 102b, and a top electrode 102c. The memory cell 102 can be connected to the other source-drain (second end) 104b of the PMOS transistor 104 via the bottom electrode 102a and the contact window 110b. The memory cell 102 may also be connected to the bit line BL via the top electrode 102c. Thereby, the source-drain 104b of the PMOS transistor of the phase change memory unit 100 located in the same column of the phase change memory array may be connected to the same bit line BL.

Figure 1B:
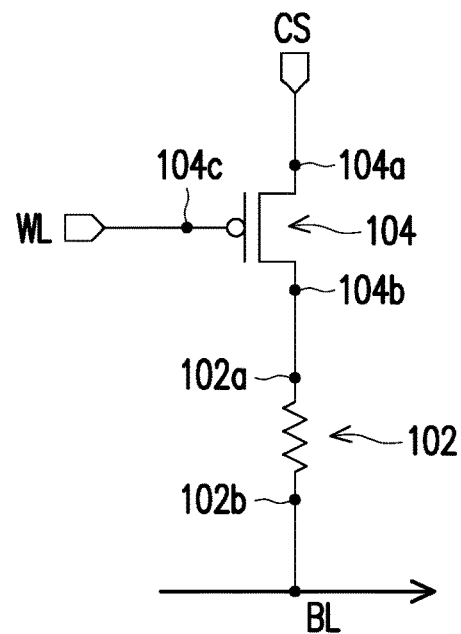
FIG. 1B is an equivalent circuit diagram of the phase change memory unit of FIG. 1A.

FIG. 1B is an equivalent circuit diagram of the memory unit of FIG. 1A. As shown in FIG. 1B, the memory unit 100 has a configuration of 1 transistor and 1 resistor (1T1R), and includes a PMOS transistor 104 and a memory cell 102. The memory cell 102 may change the resistance value based on the voltage applied between the top electrode 102c and the bottom electrode 102a, so as to implement the function of storing different values (0 or 1). A second end 102b of the memory cell 102 is connected to the bit line BL, and the gate 104c of the PMOS transistor 104 is connected to the word line WL. The source-drain 104a of the MOS transistor 104 is coupled to the power source CS and the other source-drain 104b is coupled to a first end 102a of the memory cell 102. On and off of the PMOS transistor 104 may be controlled by applying proper voltage to the word line WL, and thus operations such as programming (writing), erasing, and reading can be performed on the memory cell 102. In general, a plurality of memory units 100 will be arranged in a form of array including a plurality of rows and a plurality of columns, the gates of the PMOS transistors of the p memory units 100 in the same row connected to the same word line WL, and one of the source-drains of the PMOS transistors of the memory units 100 in the same column is connected to the same bit line BL via the memory cell 102.

In summary, as shown in FIG. 1B, the memory unit 100 according to the embodiment of the disclosure comprises at least one P-type driving element 104 and the memory cell 102. The P-type driving element has the first end 104a coupled to the power source (such as current source) CS, the second end 104b and the control end 104c coupled to the word line WL. The memory cell 102 has the first end 102a coupled to the second end 104b of the P-type driving element 104 and the second end 102b coupled to the bit line BL. Here, the P-type driving element 104 may be one to form a 1T1R configuration, or two to form a 2T1R configuration. The structure of the memory unit may be also applicable to other configurations.

Figure 2A:
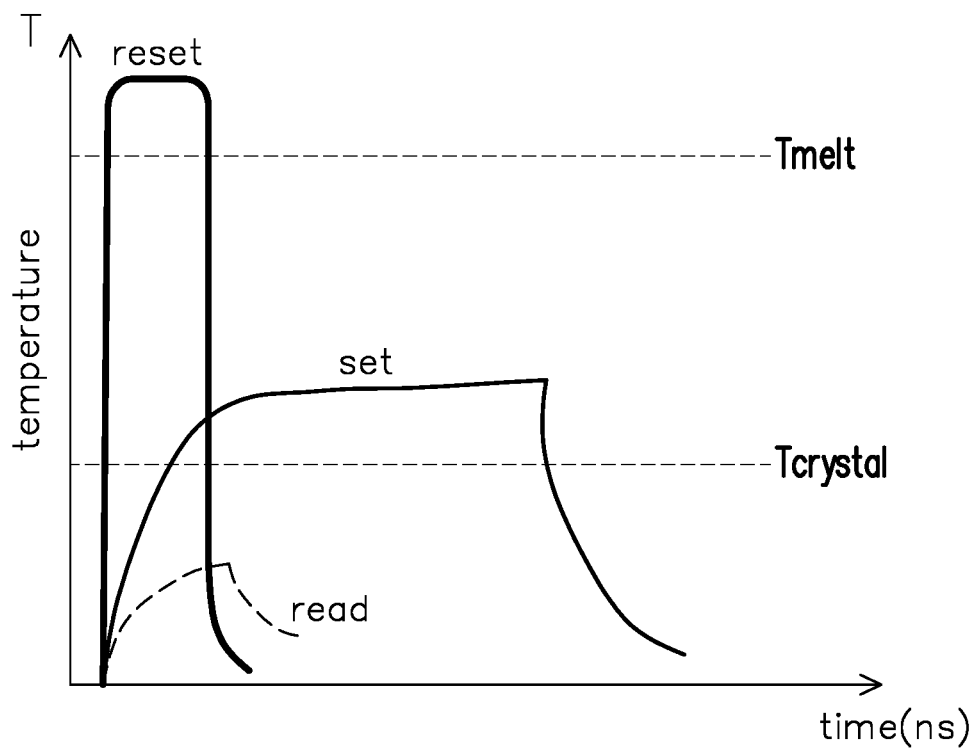
FIG. 2A shows a time-temperature diagram of the operation conditions of the phase change memory cell.
Figure 2B:
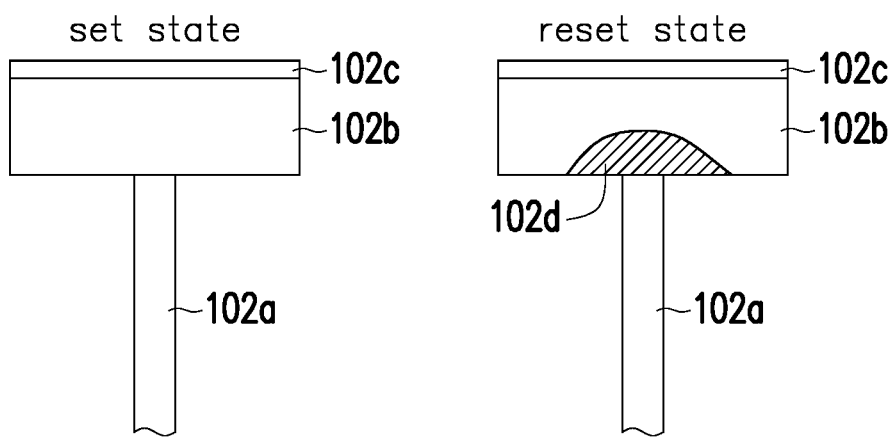
FIG. 2B is an explanatory diagram illustrating the set and reset states of the phase change memory cell.

FIG. 2A is a schematic time-temperature diagram of the operation conditions of the phase change memory, and FIG. 2B is a diagram illustrating the set and reset states of the memory cell. As shown in FIG. 2A and the left part of FIG. 2B, as a voltage applied to the memory cell 102 increases, the temperature of the phase change material layer 102b also increases. When the temperature T rises with time and exceeds the crystallization temperature Tcrystal and is lower than the melting temperature Tmelt, the phase change material layer 102b will become a crystalline state. At this time, the phase change material layer 102b is in a low resistance state, i.e., a SET state. When the voltage applied to the memory cell 102 exceeds the melting temperature Tmelt, as shown in FIG. 2A and the right part of FIG. 2B, the phase change material layer 102b starts to transform from a crystalline state to an amorphous state, and an amorphous block 102d is created. At this time, the phase change material layer 102b is in a high resistance state, i.e., a reset state. By controlling the phase change material layer 102b into the set state or the reset state, a value of "0" or "1" can be stored in the memory cell 102. In addition, as shown in FIG. 2A, when the value stored in the memory cell 102 is to be read, a read voltage can be applied to make the temperature T of the phase change material layer 102b below the crystallization temperature Tcrystal, so as to read the memory cell 102.

Figures 3A, 3B:
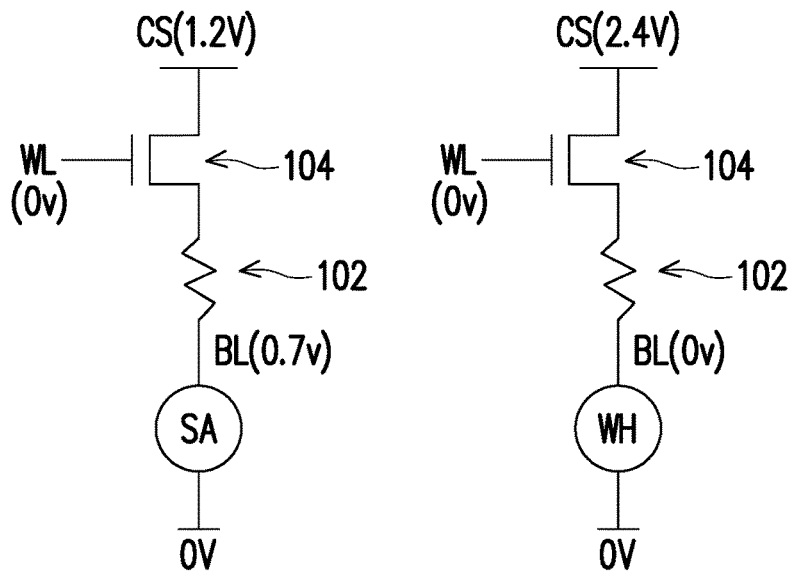
FIGS. 3A and 3B are schematic bias diagram for read and set/reset operations on the memory unit according to one embodiment of the disclosure.

FIGS. 3A and 3B are schematic bias diagram for read and set/reset operations on the memory unit according to one embodiment of the disclosure. As shown in FIG. 3A, in the reading operation, a first bias condition is applied to the memory unit 100, in which a voltage provided by the power source CS is larger than a voltage applied to the bit line BL and a voltage applied to the word line WL, and the voltage applied to the bit line BL is larger than the voltage applied to the word line WL. In one applicable example, a voltage of about 1.2V is provided from the power source CS, a voltage of about 0V is applied to the control end of the P-type driving element 104, and a voltage of about 0.7V is applied to the bit line BL. Under this first bias condition, the data stored in the memory cell 102 can be read by a sensing amplifier SA connected to the bit line.

In addition, in setting or resetting the memory unit, applying a second bias condition to the memory unit 100, in which a voltage provided by the power source CS is larger than a voltage applied to the bit line BL and a voltage applied to the word line WL, and the voltage applied to the bit line BL is substantially equal to the voltage applied to the word line WL. In one applicable example, a voltage of about 2.4V is provided from the power source CS, a voltage of about 0V is applied to the control end of the P-type driving element 104, and a voltage of about 0V is applied to the bit line BL. Under this first bias condition, further with a current provided from a write head WH, a set or reset operation can be performed on the memory unit, i.e., data can be written to or erased from the memory unit 100. Here, the write head WH can be a current source, so as to adjust a magnitude of a current or voltage to the memory cell to perform set or reset.

Figure 4:
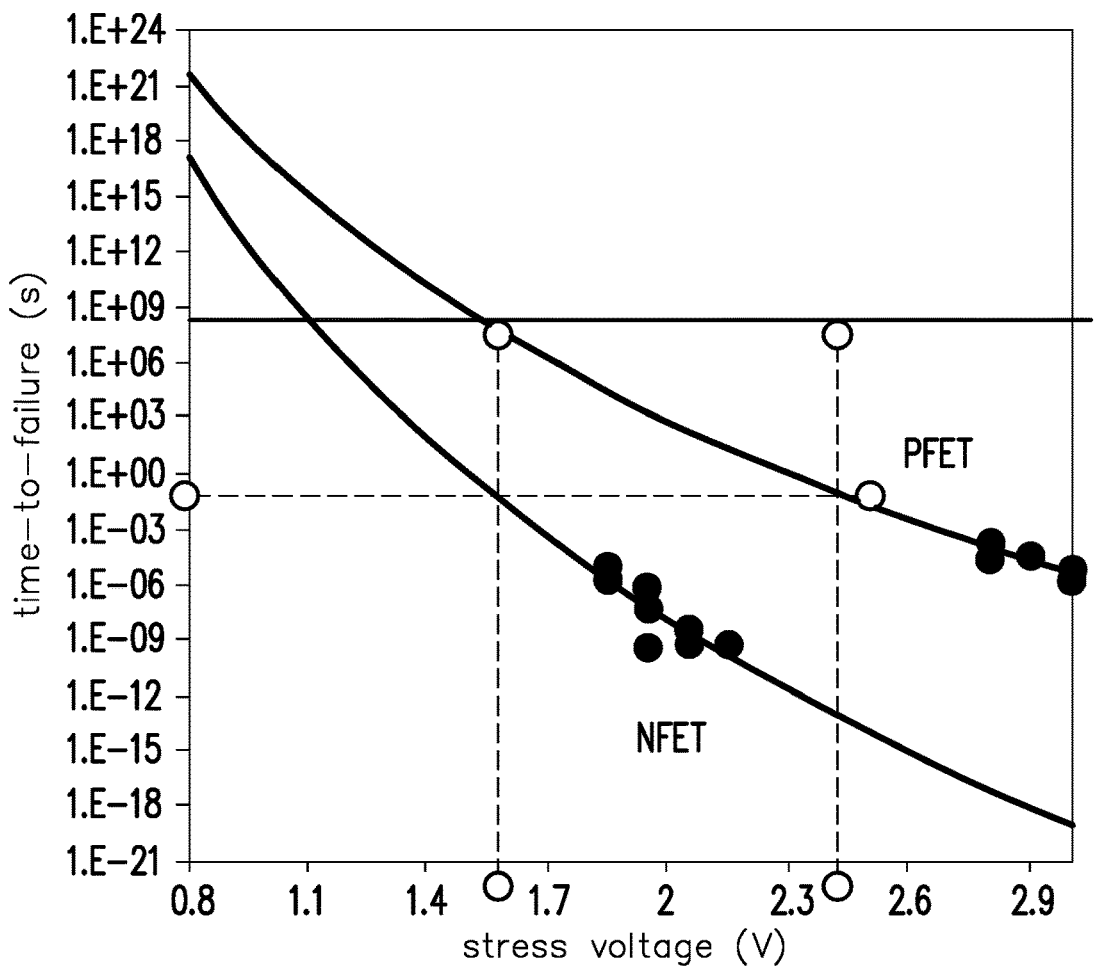
FIG. 4 is a graph showing a relationship between a stress voltage and an endurance time for PFET and NFET

FIG. 4 is a graph showing a relationship between a stress voltage and an endurance time for PFET and NFET. As shown in FIG. 4, it is a graph showing the relationship between the stress voltage and the endurance time for memory units respectively using the PFET and NFET as the driving elements under experimental conditions of 14 nm process technology. In FIG. 4, the horizontal axis represents the stress voltage, and the vertical axis represents the time-to-failure (endurance time) before the memory cell fails. The time-to-failure can also be regarded as the end of life (EOL) or its life cycle.

In the life test of gate oxide operation, the life test of time-dependent dielectric breakdown (TDDB) is the most used. As shown in FIG. 4, if the operation voltage of the embodiment is set to about 2.4V, compared to using an NMOS transistor as the driving element, when PMOS transistors are used as the driving unit, the TDDB time can reach about 1 second (s). Therefore, the TDDB time using the PMOS transistor is much longer than the TDDB time using the NMOS transistor. This result shows the technical effect that can be produced by using the PMOS transistor as the driving element, that is, the memory unit can be operated at a higher voltage and maintain a certain product life cycle. In addition, it can be seen from this figure that the endurance time for one million cycles is at least 0.05 seconds with a stress voltage of about 2.4V. Therefore, the use of PMOS transistor as the driving element can achieve higher operation voltage for the 14 nm process.

Figure 5A:
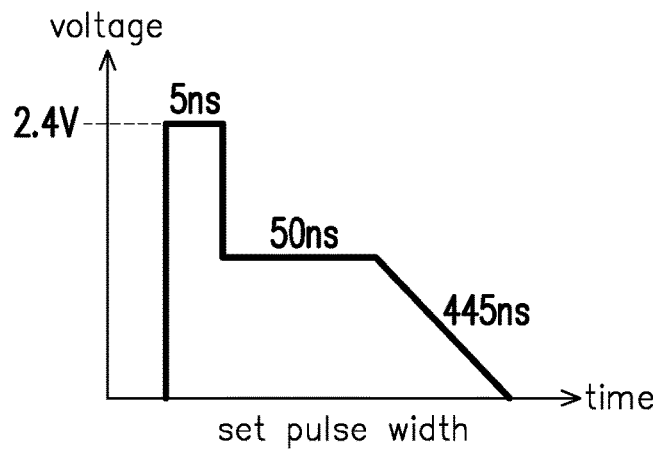
FIGS. 5A and 5B illustrate diagrams of time versus voltage for one operation cycle on the memory unit.
Figure 5B:
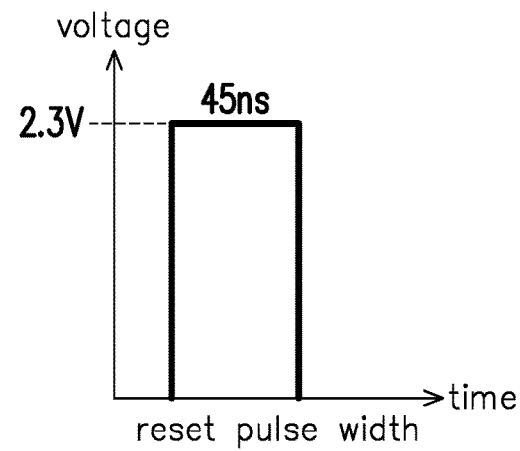

FIGS. 5A and 5B illustrate diagrams of time versus voltage for one operation cycle on the memory unit. FIGS. 5A and 5B will be used to illustrate the tolerance degree of the memory unit of the embodiment of the present disclosure. Here, the example uses a PMOS transistor as the driving element and a PCM memory cell as an illustrative example.

As shown in FIG. 5A, it shows the relationship between the set pulse width and the voltage. The set operation is performed under a stress voltage of about maximum 2.4V, and the corresponding maximum pulse width is about 5 ns. In addition, as shown in FIG. 5B, it shows the relationship between the reset pulse width and the voltage. The reset operation is performed by applying a voltage of about 2.3V, and the corresponding pulse width is about 45 ns. Therefore, in the case of one operation cycle including set and reset operations and the maximum applied voltage is about 2.4V, the total maximum 2.4 v pulse width for one cycle is equal to 5 ns plus 45 ns, that is, 50 ns.

As mentioned above, in one cycle, the memory cell needs to withstand the 2.4 v stress voltage for about 50 ns. Based on a general estimation for one million (1M) cycles, the total operation time of the memory unit of this embodiment is 50 ns×$10^6$=0.05 s (second). In other words, the endurance time (or stress time, life cycle) of the memory unit of this example can reach at least 0.05 seconds.

In contrast, if the similar condition is applied to a case using the NMOS transistor as the driving element, the same endurance time can only be achieved with a stress voltage of about 1.6V. In other words, if the memory unit is operated with the same stress voltage, its endurance time will be reduced. Therefore, compared to using the NMOS transistor as a driving element, the endurance time of the memory unit of the embodiment can be greatly improved, that is, the product life cycle can be longer.

Figure 6:
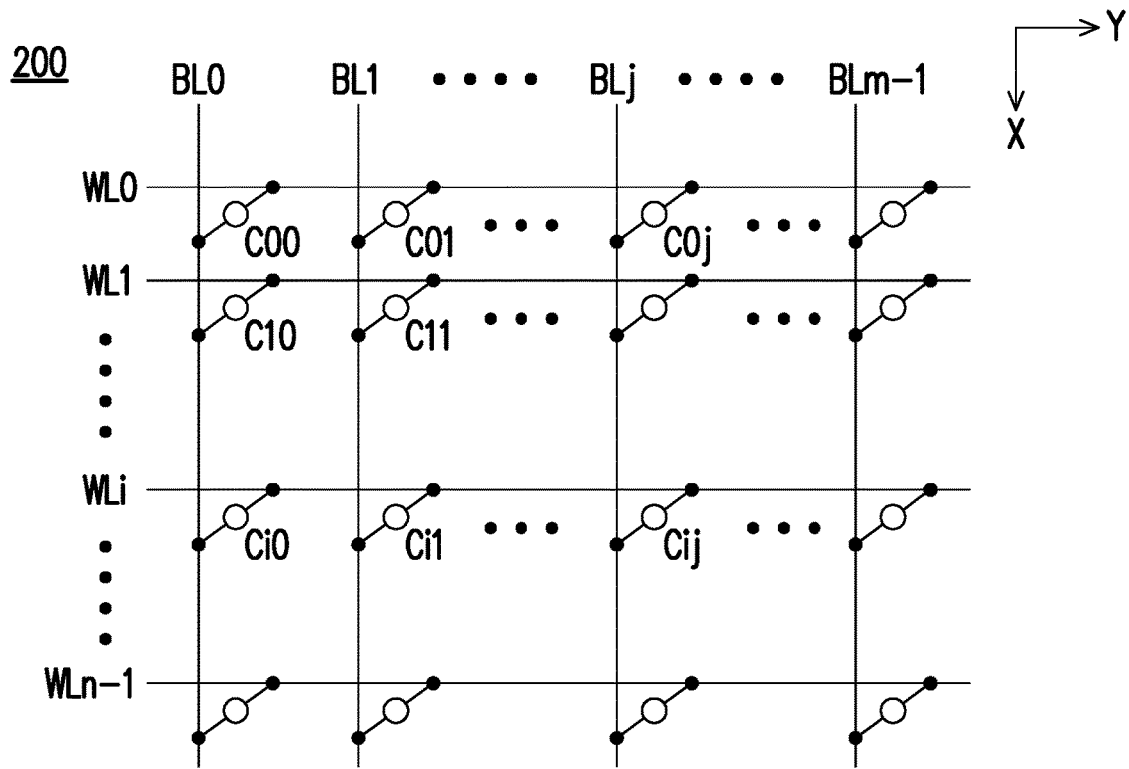
FIG. 6. shows a schematic diagram of a memory array with the memory unit of the embodiment of the disclosure.

FIG. 6. shows a schematic diagram of a memory array with the memory units of the embodiment of the disclosure. As shown in FIG. 6, according to another embodiment of the present disclosure, the memory array 200 is, for example, a configuration of n×m array. The memory array 200 comprises a plurality of word lines WLi (i=0–(n−1), n is an integer), and a plurality of bit lines BLj (j=1–(m−1), m is an integer) and a plurality of memory cells Cij (i=1–(n−1), j=0–(m−1)). The plurality of word lines WLi extends parallelly to each other in a first direction X, and the plurality of bit lines BLj extends parallelly to each other in a second direction Y substantially orthogonal to the first direction X, and are respectively intersected with the plurality of word lines. Line WLi. The plurality of memory cells Cij are respectively arranged at the intersections of the word lines WLi and the bit lines BLj.

Here, each of the plurality of memory cells Cij may be the memory unit 100 driven by the P-type driving element 102 as shown in FIG. 1B. Therefore, the memory array 200 can also be operated at a higher voltage and maintain a certain product life cycle.

In the above descriptions, although the phase change memory (PCM) is used as an example, but the memory unit 100 using the P-type driving element 104 of the embodiment can be also applicable to such as a magnetoresistive RAM (MRAM), a resistive RAM (ReRAM) and a ferroelectric RAM (FeRAM).

As described above, based on the above configuration of the memory unit and in comparison with the N-type driving element, the present disclosure utilizes the P-type driving element to drive the memory cell, the memory unit can have a longer product life cycle under higher operation voltage and the reliability can also be increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory unit, comprising:
   at least one P-type driving element, having a first end coupled to a power source, a second end and a control end coupled to a word line; and
   a memory cell, having a first end coupled to the second end of the at least one P-type driving element and a second end coupled to a bit line,
   wherein the least one P-type driving element is a PMOS transistor, and
   the PMOS transistor is made to have a time-dependent dielectric breakdown (TDDB) time reach about 1 second.

2. The memory unit of claim 1, wherein the power source is a current source.

3. The memory unit of claim 1, wherein an endurance time in one million cycles for the memory unit is at least 0.05 seconds.

4. The memory unit of claim 1, wherein a time-dependent dielectric breakdown (TDDB) time of the at least one P-type driving element is longer to a TDDB time of a N-type driving element corresponding to the at least one P-type driving element.

5. The memory unit of claim 1, wherein the memory cell comprises at least a phase change memory (PCM), a magnetoresistive RAM (MRAM), a resistive RAM (ReRAM) and a ferroelectric RAM (FeRAM).

6. An operation method for a memory unit, the memory unit including: at least one P-type driving element, having a first end coupled to a power source, a second end and a control end coupled to a word line; and a memory cell, having a first end coupled to the second end of the at least one P-type driving element and a second end coupled to a bit line, the operation method comprising:
   in reading the memory unit, applying a first bias condition to the memory unit, wherein a voltage provided by the power source is larger than a voltage applied to the bit line and a voltage applied to the word line, and the voltage applied to the bit line is larger than the voltage applied to the word line; and in setting or resetting the memory unit, applying a second bias condition to the memory unit, wherein a voltage provided by the power source is larger than a voltage applied to the bit line and a voltage applied to the word line, and the voltage applied to the bit line is substantially equal to the voltage applied to the word line.

7. The operation method of claim 6, wherein the least one P-type driving element is a PMOS transistor.

8. The operation method of claim 7, wherein the PMOS transistor is made to have a time-dependent dielectric breakdown (TDDB) time reach about 1 second.

9. The operation method of claim 8, wherein an endurance time in one million cycles for the memory unit is at least 0.05 seconds.

10. The operation method of claim 6, wherein a time-dependent dielectric breakdown (TDDB) time of the at least one P-type driving element is longer to a TDDB time of a N-type driving element corresponding to the at least one P-type driving element.

11. The operation method of claim 6, wherein the memory cell comprises at least a phase change memory (PCM), a magnetoresistive RAM (MRAM), a resistive RAM (ReRAM) and a ferroelectric RAM (FeRAM).

12. A memory array, comprising:
a plurality of word lines, arranged to be parallelly extended in a first direction;
a plurality of bit lines, arranged to be parallelly extended in a second direction that is substantially orthogonal to the first direction, and respectively intersected with the plurality of word lines; and
a plurality of memory unit, respectively arranged on intersections of the plurality of word lines and the plurality of bit lines,
wherein each of the plurality of memory unit further comprises:
at least one P-type driving element, having a first end coupled to a power source, a second end and a control end coupled to a corresponding word line of the plurality of word lines; and
a memory cell, having a first end coupled to the second end of the at least one P-type driving element and a second end coupled to a corresponding bit line of the plurality of bit lines,
wherein the least one P-type driving element is a PMOS transistor,
the PMOS transistor is made to have a time-dependent dielectric breakdown (TDDB) time reach about 1 second.

13. The memory array of claim 12, wherein the power source is a current source.

14. The memory array unit of claim 12, wherein an endurance time in one million cycles for the memory unit is at least 0.05 seconds.

15. The memory unit of claim 12, wherein a time-dependent dielectric breakdown (TDDB) time of the at least one P-type driving element is longer to a TDDB time of a N-type driving element corresponding to the at least one P-type driving element.

16. The memory array of claim 12, wherein the memory cell comprises at least a phase change memory (PCM), a magnetoresistive RAM (MRAM), a resistive RAM (ReRAM) and a ferroelectric RAM (FeRAM).

17. A memory unit, comprising:
at least one P-type driving element, having a first end coupled to a power source, a second end and a control end coupled to a word line; and
a memory cell, having a first end coupled to the second end of the at least one P-type driving element and a second end coupled to a bit line,
wherein when writing the memory unit, the at least one P-type driving element is turned on by applying a voltage to the word line, and the power source is configured to provide a first voltage for writing the memory unit, and
when reading the memory unit, the at least one P-type driving element is turned on by applying the voltage to the word line, and the power source is configured to provide a second voltage for reading the memory unit.

18. The memory unit of claim 17,
wherein the least one P-type driving element is a PMOS transistor.

19. The memory unit of claim 17, wherein the PMOS transistor is made to have a time-dependent dielectric breakdown (TDDB) time reach about 1 second.

20. The memory unit of claim 19, wherein an endurance time in one million cycles for the memory unit is at least 0.05 seconds.

21. The memory unit of claim 17, wherein a time-dependent dielectric breakdown (TDDB) time of the at least one P-type driving element is longer to a TDDB time of a N-type driving element corresponding to the at least one P-type driving element.

* * * * *